US012606908B2

(12) United States Patent
Baek et al.

(10) Patent No.: US 12,606,908 B2
(45) Date of Patent: Apr. 21, 2026

(54) SUBSTRATE PROCESSING SYSTEM AND METHOD OF MANUFACTURING SEMICONDUCTOR DEVICE USING THE SAME

(71) Applicant: SAMSUNG ELECTRONICS CO., LTD., Suwon-si (KR)

(72) Inventors: Songyi Baek, Hwaseong-si (KR); Youngtack Sim, Hwaseong-si (KR); Jiwon Kwak, Suwon-si (KR); Sejin Kyung, Seoul (KR); Daewee Kong, Yongin-si (KR); Taemin Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 747 days.

(21) Appl. No.: 17/878,622

(22) Filed: Aug. 1, 2022

(65) Prior Publication Data

US 2023/0175124 A1     Jun. 8, 2023

(30) Foreign Application Priority Data

Dec. 3, 2021     (KR) ........................ 10-2021-0171568

(51) Int. Cl.
| | |
|---|---|
| *C23C 16/44* | (2006.01) |
| *C23C 16/455* | (2006.01) |
| *H01L 21/02* | (2006.01) |

(52) U.S. Cl.
CPC .... *C23C 16/4405* (2013.01); *C23C 16/45546* (2013.01); *H01L 21/0217* (2013.01)

(58) Field of Classification Search
CPC .......... C23C 16/4405; C23C 16/45546; H01L 21/0217
See application file for complete search history.

(56) References Cited

U.S. PATENT DOCUMENTS

| | | | |
|---|---|---|---|
| 2002/0018860 A1* | 2/2002 | Filippou ................. | B05D 3/08 |
| | | | 427/407.1 |
| 2004/0028590 A1* | 2/2004 | Tsuji .................... | F23M 11/042 |
| | | | 205/628 |

(Continued)

FOREIGN PATENT DOCUMENTS

| | | |
|---|---|---|
| JP | 2000-24447 A | 1/2000 |
| KR | 10-0407108 B1 | 12/2003 |

(Continued)

OTHER PUBLICATIONS

Ip.com search (Year: 2025).*

*Primary Examiner* — Zandra V Smith
*Assistant Examiner* — Andre C Stevenson
(74) *Attorney, Agent, or Firm* — Sughrue Mion, PLLC

(57) ABSTRACT

A substrate processing system includes: a process chamber that performs a semiconductor process on a substrate; a first oxygen supply unit; a first chamber that receives a gas containing oxygen ($O_2$) from the first oxygen supply unit, receives exhaust gases discharged from the process chamber, and oxidizes the exhaust gas using the oxygen supplied from the first oxygen supply unit; a second chamber connected to the first chamber, and that receives a first treatment gas from the first chamber and burns the first treatment gas; a third chamber connected to the second chamber, and that receives a second treatment gas from the second chamber and performs a wetting treatment of the second treatment gas; and a tank disposed below the first to third chambers and connected to each of the first to third chambers.

16 Claims, 6 Drawing Sheets

(56)     References Cited

U.S. PATENT DOCUMENTS

| | | | |
|---|---|---|---|
| 2004/0115575 A1* | 6/2004 | Kayahara | F23C 9/08 |
| | | | 431/9 |
| 2006/0135631 A1* | 6/2006 | Kopponen | C10G 2/33 |
| | | | 518/716 |
| 2007/0086931 A1 | 4/2007 | Raoux et al. | |
| 2007/0261718 A1* | 11/2007 | Randhawa | B08B 3/08 |
| | | | 134/198 |
| 2010/0047137 A1* | 2/2010 | Carlson | B01J 19/123 |
| | | | 422/186.3 |
| 2015/0252473 A1* | 9/2015 | Dickinson | C23C 16/4405 |
| | | | 118/723 R |
| 2016/0023160 A1 | 1/2016 | Stuhler et al. | |
| 2016/0025337 A1 | 1/2016 | Comrie | |
| 2016/0237869 A1 | 8/2016 | Yoon | |
| 2017/0062254 A1* | 3/2017 | Hirochi | C23C 16/45574 |

FOREIGN PATENT DOCUMENTS

| | | |
|---|---|---|
| KR | 10-0623368 B1 | 9/2006 |
| KR | 10-2009-0031231 A | 3/2009 |
| KR | 10-1623476 B1 | 6/2016 |
| KR | 10-2272955 B1 | 7/2021 |
| WO | 2009/038326 A2 | 3/2009 |

* cited by examiner

SUBSTRATE PROCESSING SYSTEM AND METHOD OF MANUFACTURING SEMICONDUCTOR DEVICE USING THE SAME

CROSS-REFERENCE TO THE RELATED APPLICATION

This application claims the benefit under 35 USC 119(a) of Korean Patent Application No. 10-2021-0171568 filed on Dec. 3, 2021 in the Korean Intellectual Property Office, the entire disclosure of which is incorporated herein by reference for all purposes.

BACKGROUND

Embodiments of the present disclosure relate to a substrate processing system and a method for manufacturing a semiconductor device using the same.

In a semiconductor manufacturing process, various treatments such as a deposition treatment, a heat treatment, and an etching treatment may be performed on a substrate or the like in a process chamber. Exhaust gases generated in the semiconductor manufacturing process may include unreacted reaction gases or reaction byproducts generated due to various treatments. The exhaust gases in the semiconductor manufacturing processes are toxic gases, and may have a very harmful influence on the human body and the environment. Therefore, it is important to treat exhaust gases to be chemically safe gases before releasing the exhaust gases into the atmosphere.

SUMMARY

Example embodiments provide a substrate processing system capable of minimizing discharge of a harmful gas while increasing a preventive maintenance (PM) cycle of a scrubber, and a method of manufacturing a semiconductor device using the same.

According to embodiments of the present disclosure, a substrate processing system is provided. The substrate processing system includes: a process chamber configured to perform a semiconductor process on a substrate; a first oxygen supply unit that includes a first gas containing oxygen ($O_2$); a first chamber connected to the first oxygen supply unit and the process chamber, and configured to receive the first gas containing the oxygen from the first oxygen supply unit, receive exhaust gases discharged from the process chamber, and oxidize at least some of the exhaust gases using the oxygen supplied from the first oxygen supply unit; a second chamber connected to the first chamber, and configured to receive a first treatment gas from the first chamber and burn the first treatment gas; a third chamber connected to the second chamber, and configured to receive a second treatment gas from the second chamber and perform a wetting treatment of the second treatment gas; and a tank disposed below the first chamber, the second chamber, and the third chamber, and connected to each of the first chamber, the second chamber, and the third chamber.

According to embodiments of the present disclosure, a substrate processing system is provided. The substrate processing system includes: a process chamber configured to perform a semiconductor process on a substrate; a scrubber connected to the process chamber and configured to treat a first exhaust gas discharged from the process chamber as a part of a first process cycle of the semiconductor process;

and a diversion line connected to the process chamber and configured to separate a second exhaust gas discharged from the process chamber as a part of a second process cycle of the semiconductor process; and a controller including at least one processor, the controller configured to cause the first process cycle of the semiconductor process and the second process cycle of the semiconductor process to be alternately repeated by controlling at least one from among the process chamber, the scrubber, and the diversion line, wherein the scrubber includes: a first chamber that is configured to obtain a first treatment gas by oxidizing the first exhaust gas; a second chamber connected to the first chamber and configured to receive the first treatment gas from the first chamber and obtain a second treatment gas by burning the first treatment gas; and a third chamber connected to the second chamber and configured to receive the second treatment gas from the second chamber and perform a wetting treatment of the second treatment gas.

According to embodiments of the present disclosure, a method of manufacturing a semiconductor device, using a substrate processing system that includes a process chamber, a first gas supply unit and a second gas supply unit connected to the process chamber, a scrubber connected to the process chamber, and a diversion line connected to the process chamber, is provided. The method includes: loading a substrate onto a substrate holder disposed in the process chamber; forming a first material layer on a surface of the substrate by supplying a first reaction gas into the process chamber using the first gas supply unit; discharging, after forming the first material layer, a first exhaust gas including an extra first reaction gas from the process chamber; forming, after discharging the first exhaust gas, a second material layer on the surface of the substrate by supplying a second reaction gas into the process chamber using the second gas supply unit; discharging, after forming the second material layer, a second exhaust gas including an extra second reaction gas from the process chamber; introducing the first exhaust gas into the scrubber and treating the first exhaust gas in the scrubber; and introducing the second exhaust gas into the diversion line and then treating the second exhaust gas, wherein the second exhaust gas includes a nitrogen-containing gas.

BRIEF DESCRIPTION OF DRAWINGS

The above and other aspects, features, and advantages of embodiments of the present disclosure will be more clearly understood from the following detailed description, taken in conjunction with the accompanying drawings, in which.

DETAILED DESCRIPTION

Hereinafter, non-limiting example embodiments of the present disclosure will be described with reference to the accompanying drawings.

Hereinafter, terms such as "upper", "middle", and "lower" may be replaced with other terms such as "first", "second", and "third" and be used to describe components of embodiments of the present disclosure. The terms such as "first", "second", and "third" may be used to describe various components, but these components are not limited by the terms, and a "first component" may also be referred to as, for example, a "second component."

A substrate processing system according to example embodiments will be described with reference to FIGS. 1 and 2.

Figure 1:
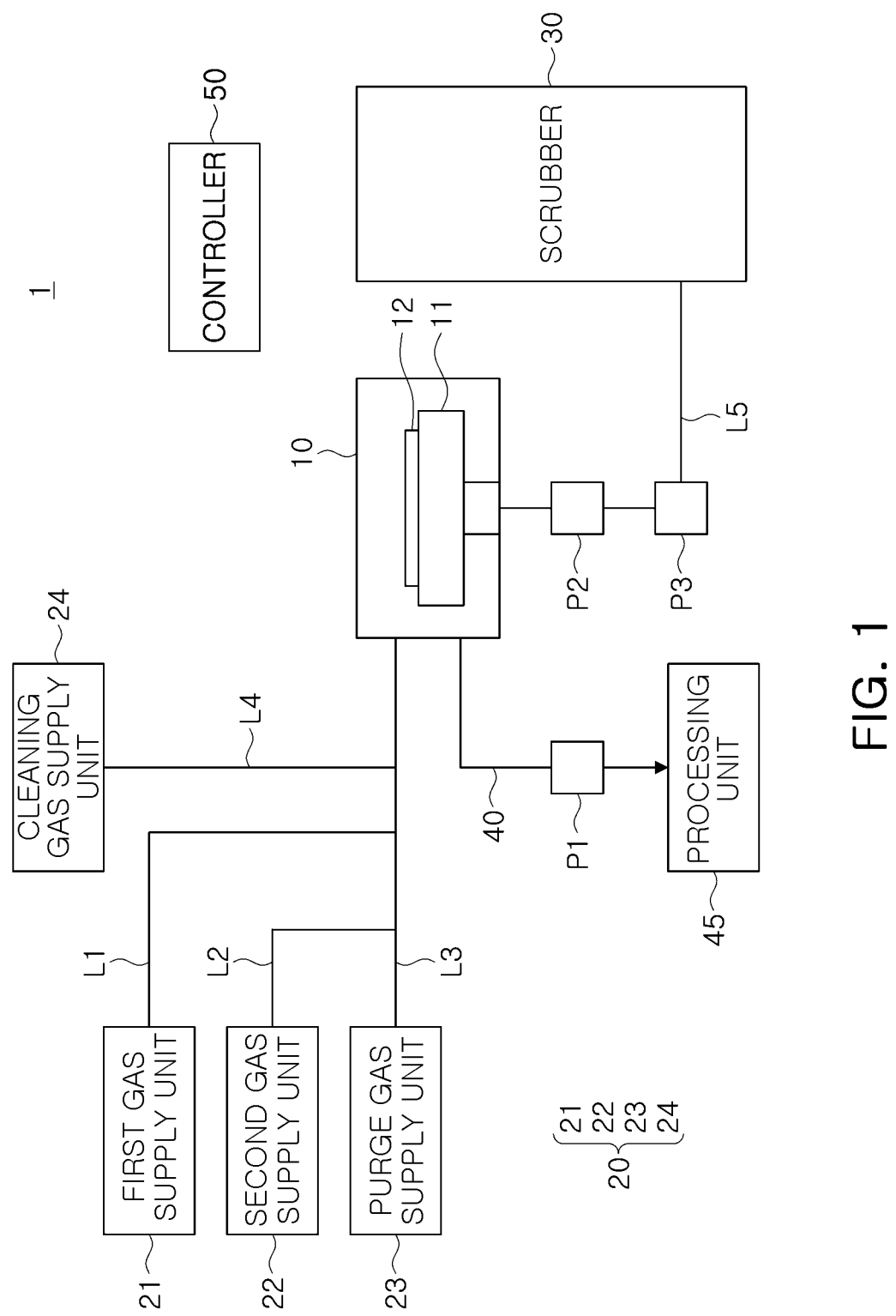
FIG. 1 is a conceptual diagram of a substrate processing system according to example embodiments.

FIG. 1 is a conceptual diagram of a substrate processing system 1 according to example embodiments.

Figure 2:
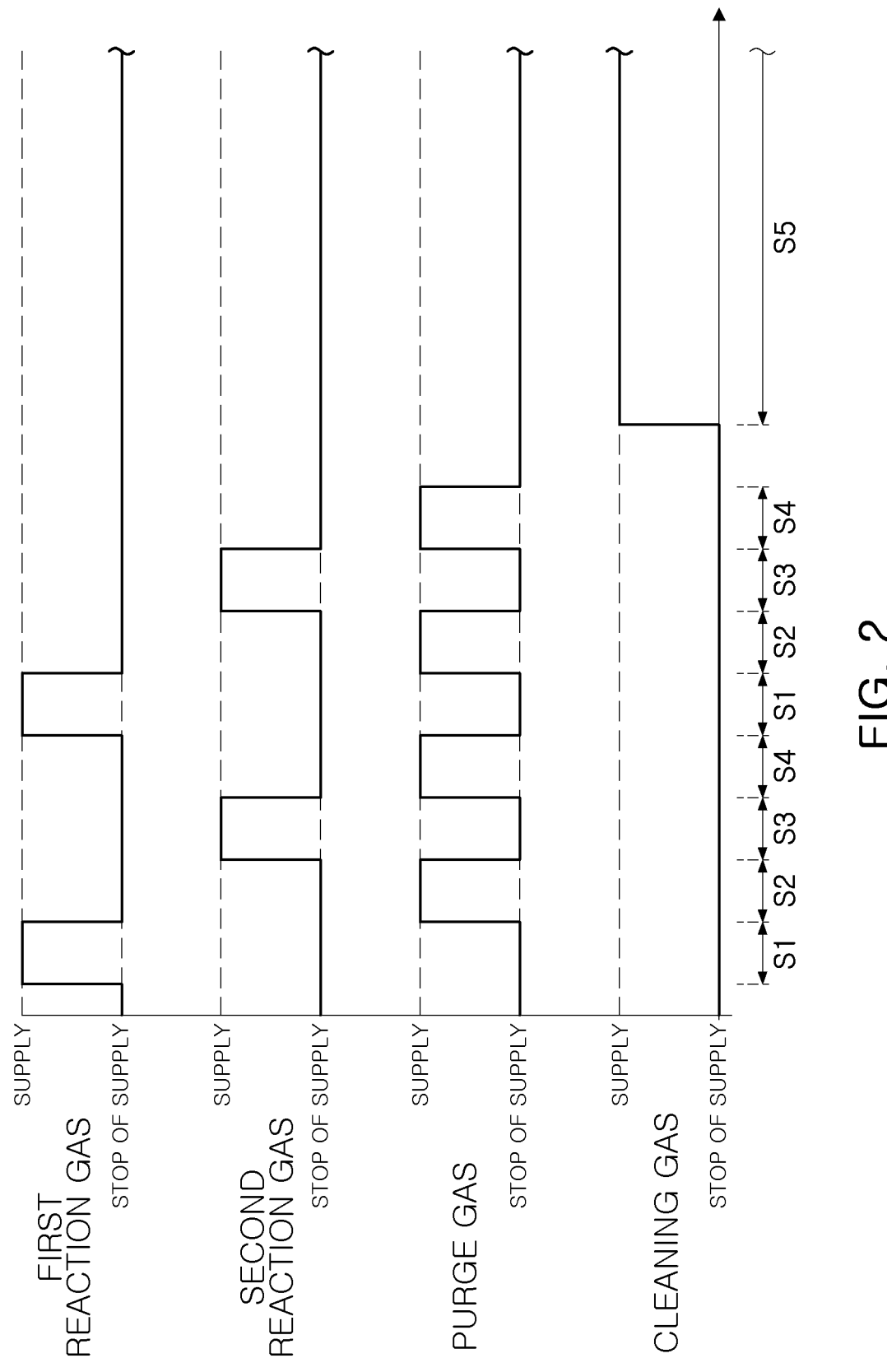
FIG. 2 is a chart diagram illustrating supply states of gases according to example embodiments.

FIG. 2 is a chart diagram illustrating supply states of gases by a gas supply unit 20 according to example embodiments.

Referring to FIGS. 1 and 2, a substrate processing system 1 according to example embodiments includes a process chamber 10, a gas supply unit 20, a scrubber 30, and a diversion line 40. The gas supply unit 20 may include a first gas supply unit 21, a second gas supply unit 22, a purge gas supply unit 23, and a cleaning gas supply unit 24 that supply different gases. The substrate processing system 1 may further include a controller 50 configured to control each of the process chamber 10, the gas supply unit 20, the scrubber 30, and the diversion line 40. According to embodiments, the controller 50 may further control pumps (e.g., a pump P1, a pump P2, and a pump P3 to be described below), valves (e.g., a valve V1 and a valve V2 to be described below), other supply units (e.g., a first oxygen supply G1, a second oxygen supply unit G2, and a fuel supply G3 to be described below), and/or any other components that may be included in or connected to the process chamber 10, the gas supply unit 20, the scrubber 30, and the diversion line 40.

According to embodiments, the controller 50 may be connected to the above components in a wired (e.g., via a wire) or wireless manner (e.g., via a wireless transmitter and a wireless receiver) to perform control of the above components. According to embodiments, the controller 50 may include at least one processor and memory storing computer instructions. The computer instructions, when executed by the at least one processor, may be configured cause the methods (e.g., refer to FIGS. 2-4 and 7) of the present disclosure to be performed by causing the controller 50 to control the components of embodiments of the present disclosure.

The process chamber 10 may include a substrate holder 11 disposed therein. The substrate holder 11 may be configured to support a substrate 12 thereon. A thin film may be deposited on a surface of the substrate 12 disposed on the substrate holder 11 by gases injected by the gas supply unit 20 to be described later. FIG. 1 schematically illustrates only some components of the process chamber 10, and the process chamber 10 may further include components other than those illustrated in FIG. 1. For example, the process chamber 10 may further include a shower head, an upper electrode, a lower electrode, and the like, according example embodiments. The process chamber 10 may be a single-type chamber or a batch-type chamber.

Various processes for manufacturing a semiconductor may be performed in the process chamber 10. In an example embodiment, a deposition process of forming a thin film on the surface of the substrate 12 may be performed in the process chamber 10. The deposition process may be performed, for example, by atomic layer deposition (ALD). Plasma-enhanced atomic layer deposition (PEALD) or thermal atomic layer deposition may be performed in the process chamber 10.

The process performed in the process chamber 10 is not limited to the ALD, and various processes required for manufacturing a semiconductor may be performed in the process chamber 10.

In an example embodiment, a thin film may be formed on the surface of the substrate 12 by chemical vapor deposition (CVD) in the process chamber 10. Plasma-enhanced chemical vapor deposition (PECVD) or thermal chemical vapor deposition may be performed in the process chamber 10.

In another example embodiment, a process of etching the thin film may be performed in the process chamber 10. For example, a dry etching process may be performed in the process chamber 10.

Exhaust gases may be discharged from the process chamber 10 by various processes performed in the process chamber 10. The exhaust gases discharged from the process chamber 10 may include, for example, a gas having high reactivity, such as dichlorosilane (DCS: $SiH_2Cl_2$), $SiCl_4$, $WF_6$, $Zr[(CH_3)_2N]_4$, and $SiH_4$, a nitrogen-containing gas such as $NH_3$, a greenhouse gas such as a fluorinated gas, and the like. The exhaust gases discharged from the process chamber 10 may be treated to become chemically safe gases before being discharged into the atmosphere.

The exhaust gases discharged from the process chamber 10 may be injected into and treated in the scrubber 30 and the diversion line 40. The treatment of the exhaust gases discharged from the process chamber 10 will be described in detail later.

The gas supply unit 20 may be connected to the process chamber 10 to inject gases into the process chamber 10. The gas supply unit 20 may be provided in the singular or in the plural depending on a process performed in the process chamber 10. In an example embodiment, the gas supply unit 20 may be formed in the plural, and may include, for example, the first gas supply unit 21, the second gas supply unit 22, the purge gas supply unit 23, and the cleaning gas supply unit 24. The first gas supply unit 20, the second gas supply unit 22, the purge gas supply unit 23, and the cleaning gas supply unit 24 may provide gases into the process chamber 10 through pipes L1, L2, L3, and L4, respectively.

A first reaction gas supplied from the first gas supply unit 21, a second reaction gas supplied from the second gas supply unit 22, and a purge gas supplied from the purge gas supply unit 23 may be injected into the process chamber 10 in the form of sequential pulses, as illustrated in FIG. 2. In an example embodiment, in the process chamber 10, an ALD process may be performed by sequentially depositing the first reaction gas and the second reaction gas on an upper surface of the substrate 12. A section S1 in which the first reaction gas is injected, a section S2 in which the purge gas is injected, a section S3 in which the second reaction gas is injected, and a section S4 in which the purge gas is injected may form one cycle, and the cycle may be performed once or twice or more, such that a thin film may be deposited on the substrate 12. An example embodiment in which a cleaning treatment is performed after the cycle including sections S1 to S4 is repeatedly executed twice has been illustrated in FIG. 2, but the number of times of the execution of the cycle is not limited thereto. The cycle including sections S1 to S4 may also be executed once or three or more times, such that the thin film may be formed on the surface of the substrate 12.

The first gas supply unit 21 and the second gas supply unit 22 may supply a precursor and a reactant, which are raw materials of the thin film to be formed on the upper surface of the substrate 12, respectively. As an example embodiment, a case where a silicon nitride ($SiN_x$) thin film is formed on the surface of the substrate 12 by an ALD process will be described by way of example. The first gas supply unit 21 may supply dichlorosilane (DCS: $SiH_2Cl_2$) as a precursor for forming the silicon nitride thin film, and the second gas supply unit 22 may supply ammonia ($NH_3$) as a reactant for forming the silicon nitride thin film. The gases supplied by the first gas supply unit 21 and the second gas supply unit 22 react with each other, for example, as represented in the following Reaction Formula 1, such that a silicon nitride ($Si_3N_4$) thin film may be formed on the surface of the substrate 12.

$$3SiH_2Cl_2+4NH_3\rightarrow Si_3N_4+6HCl+6H_2 \qquad \text{[Reaction Formula 1]}$$

Referring to FIG. 2, the precursor may be supplied from the first gas supply unit 21 in section S1, and the reactant may be supplied from the second gas supply unit 22 in section S3. In section S2 (i.e., a section after the precursor is supplied and before the reactant is supplied) between section S1 and section S3, an extra precursor that is not deposited on the substrate 12 may remain in the process chamber 10. In order to prevent the extra precursor from chemically reacting with the reactant injected thereafter, the extra precursor in the process chamber 10 may be discharged to the outside of the process chamber 10 by injecting a purge gas before the reactant is injected (i.e., in section S2). Similarly, in section S4 (i.e., a section after the reactant is supplied and before the precursor is supplied) between section S3 and a section S1 of the next cycle, an extra reactant that is not deposited on the substrate 12 may be discharged to the outside of the process chamber 10 by injecting the purge gas into the process chamber 10. The purge gas may include a gas that hardly has reactivity, such as nitrogen ($N_2$), an inert gas (e.g., argon (Ar), etc.).

The extra first and second reaction gases discharged by the purge gas may be exhaust gases generated by a semiconductor manufacturing process. The extra first and second reaction gases may be moved to and removed in a scrubber 30 or a diversion line 40 to be described later. An exhaust gas treatment method in the scrubber 30 or the diversion line 40 will be described later.

When the cycle including sections S1 to S4 of FIG. 2 is performed once or twice or more, a thin film may be deposited on an inner wall of the process chamber 10 as well as the surface of the substrate 12. After the deposition of the thin film on the surface of the substrate 12 is completed and the substrate 12 is taken out (i.e., in section S5) of the process chamber 10, the cleaning gas supply unit 24 may supply a cleaning gas into the process chamber 10. The cleaning gas may decompose the thin film deposited on the inner wall of the process chamber 10. In an example embodiment, when the thin film is the silicon nitride ($SiN_x$) thin film, the cleaning gas may include nitrogen fluoride ($NF_3$), and by-products such as silicon fluoride ($SiF_x$), nitrogen ($N_2$), and fluorine ($F_2$) may be generated by the cleaning. The by-products generated by the cleaning may be exhaust gases generated by the semiconductor manufacturing process. The by-products generated by the cleaning may be moved to and processed in a scrubber 30 to be described later. A specific exhaust gas treatment method in the scrubber 30 will be described later.

The scrubber 30 and the diversion line 40 may treat the exhaust gases generated by the semiconductor manufacturing process. After the semiconductor manufacturing process (e.g., a thin film deposition process and a cleaning process) is completed in the process chamber 10, extra reaction gases, reaction by-products, and the like, may be discharged as the exhaust gases. In an example embodiment, when the silicon nitride (SiNx) thin film is formed on the surface of the substrate, DCS, which is the extra precursor, may be discharged in section S2, ammonia ($NH_3$), which is the extra reactant, may be discharged in section S4, and silicon fluoride ($SiF_x$), which is the by-product of the cleaning process, may be discharged in section S5. That is, the exhaust gases discharged from the process chamber 10 may include DCS, $NH_3$, $SiF_x$, and the like.

DCS, $NH_3$, $SiF_x$, and the like, in the exhaust gases may be treated in different manners. For example, DCS has a low auto-ignition temperature of 55° C., and may thus be treated by reacting with oxygen. On the other hand, $NH_3$ generates nitrogen oxide ($NO_x$) by oxidation, and thus, may not be oxidized and treated like DCS. $NH_3$ is water-soluble, and may thus be dissolved and treated in water.

When the substrate processing system 1 includes only the scrubber 30, a nitrogen-containing gas such as $NH_3$ injected into the scrubber 30 may be burned in the scrubber 30, such that nitrogen oxide ($NO_x$) may be generated. In order to prevent the generation of the nitrogen oxide ($NO_x$), a wetting-treatment may be performed on the exhaust gas in the scrubber as a pre-treatment of burning to remove the water-soluble nitrogen-containing gas. However, chemical reactions of the following Reaction Formula 2, Reaction Formula 3, and Reaction Formula 4 proceed by the wetting-treatment of the exhaust gas, solid by-products may be generated in the scrubber, and a preventive maintenance cycle of the scrubber may thus be shortened.

$$SiH_2Cl_{2(g)}+H_2O_{(l)}\rightarrow[H_2SiO]_{n(s)}+HCl_{(aq)} \qquad \text{[Reaction Formula 2]}$$

$$NH_{3(g)}+H_2O_{(l)}\rightarrow NH_4{}^+{}_{(aq)}+OH^-{}_{(aq)} \qquad \text{[Reaction Formula 3]}$$

$$HCl_{(aq)}+NH_4{}^+{}_{(aq)}\rightarrow[NH_4]^+[Cl]^-{}_{(s)}+H^+{}_{(aq)} \qquad \text{[Reaction Formula 4]}$$

In addition, due to the wetting treatment before a burning treatment, the exhaust gas and a fuel gas may be incompletely burned in a burning step, such that an untreated exhaust gas may remain.

The substrate processing system 1 according to example embodiments may include the scrubber 30 and the diversion line 40 separated from the scrubber 30. In order to prevent a problem caused by the introduction of the nitrogen-containing gas such as $NH_3$ into the scrubber 30, the nitrogen-containing gas may be separated into and treated in the diversion line 40, and the remaining exhaust gases may be injected into and treated in the scrubber 30. The nitrogen-containing gas injected into the diversion line 40 may be introduced into a processing unit 45 and may be neutralized by an acid solution or removed by a separate scrubber. Accordingly, it is possible to increase a preventive maintenance (PM) cycle of the scrubber 30 while decreasing the discharge of environmental pollution regulation materials and nitrogen oxide ($NO_x$).

Separation of the exhaust gases discharged from the process chamber 10 may be performed at a cycle that is the same as or similar to that of the injection of the reaction gases introduced into the process chamber 10. Referring to FIG. 2, the first reaction gas may be discharged from the process chamber 10 in a first process cycle including section S1 and section S2, the second reaction gas may be discharged from the process chamber 10 in a second process cycle including section S3 and section S4, and a by-product by a cleaning treatment may be discharged in a third process cycle including section S5. In an example embodiment, when the silicon nitride (SiNx) film is deposited on the substrate 12 in the process chamber 10, DCS may be discharged in the first process cycle including section S1 and section S2, $NH_3$ may be discharged in the second process cycle including section S3 and section S4, and $SiF_x$ or the like may be discharged in the third process cycle including section S5. The exhaust gas discharged from the process chamber 10 in the first process cycle including section S1 and section S2 may be injected into the scrubber 30, the exhaust gas discharged from the process chamber 10 in the second process cycle including section S3 and section S4 may be injected into the diversion line 40, and the exhaust gas discharged from the process chamber 10 in the third process cycle including section S5 may be injected into the scrubber 30. Since the gases are sequentially injected into the process chamber 10 for each process cycle, the exhaust gases discharged from the process chamber 10 may be sequentially separated and treated.

The substrate processing system 1 according to example embodiments may further include a pump P1 for introducing the exhaust gas from the process chamber 10 to the processing unit 45 through the diversion line 40. In addition, the substrate processing system 1 according to example embodiments may further include a pump P2 and a pump P3 for introducing the exhaust gas from the process chamber 10 to the scrubber 30 through a pipe L5. However, units for introducing the exhaust gas are not limited thereto, and a type, the number, and the like, of the units for introducing the exhaust gas may be changed according to example embodiments.

Hereinafter, an exhaust gas treatment method in a scrubber 30 will be described in detail with reference to FIG. 3.

Figure 3:
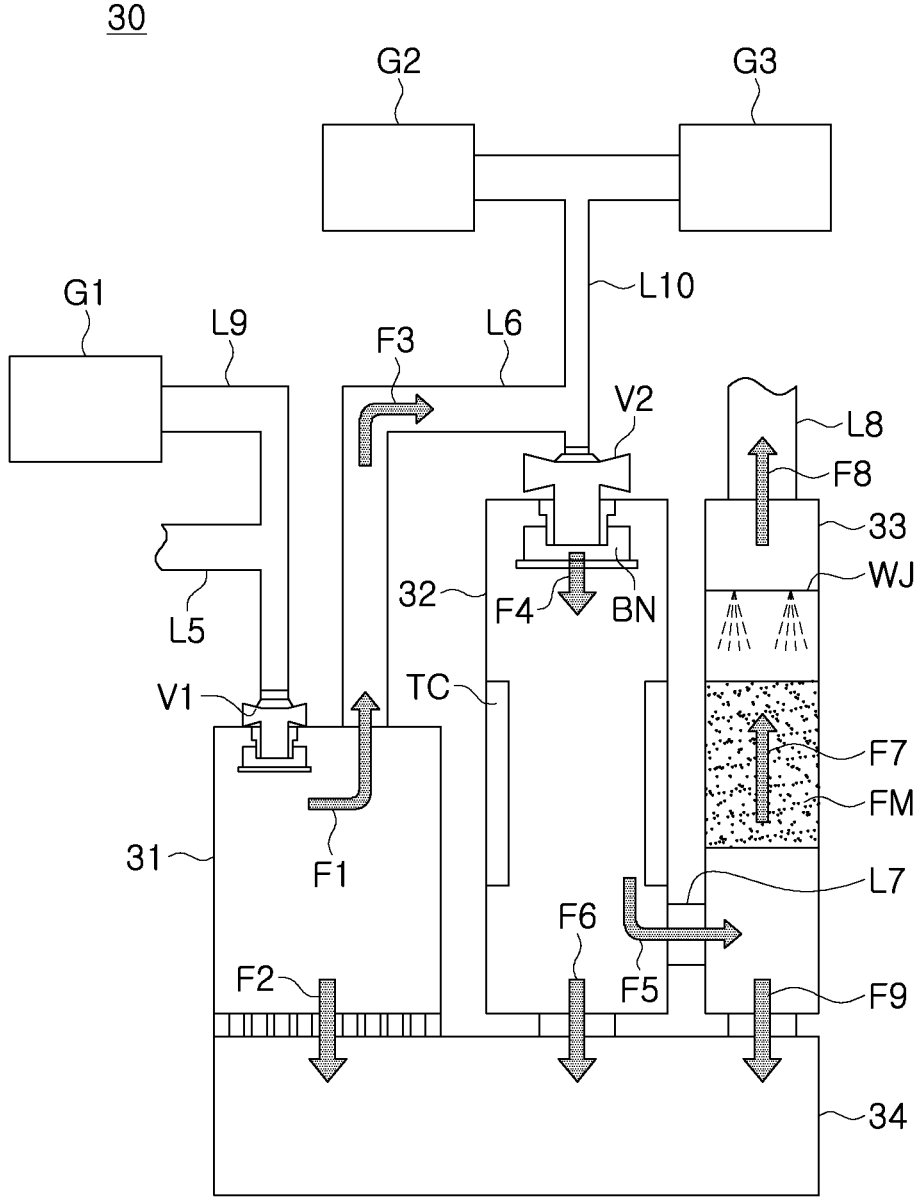
FIG. 3 is a schematic cross-sectional view of a scrubber according to example embodiments.

FIG. 3 is a schematic cross-sectional view of a scrubber 30 according to example embodiments.

Referring to FIG. 3, the scrubber 30 may include a first chamber 31, a second chamber 32, a third chamber 33, and a tank 34. The first chamber 31, the second chamber 32, and the third chamber 33 may be connected to each other in series, and the tank 34 may be disposed below the first chamber 31, the second chamber 32, and the third chamber 33 so as to be connected to the first chamber 31, the second chamber 32, and the third chamber 33. The tank 34 may be, for example, a water tank containing washing water.

In each of the first chamber 31, the second chamber 32, and the third chamber 33, an oxidation treatment, a burning treatment, and a wetting treatment of the exhaust gas may be performed, respectively. The scrubber 30 according to example embodiments may perform an oxidation treatment instead of the wetting treatment in the first chamber 31 before the burning treatment of the exhaust gas in order to prevent problems (e.g., an incomplete burning problem of the exhaust gases, a generation problem of a solid by-product, etc.) due to the wetting treatment before the burning treatment. That is, the exhaust gas may be oxidization-treated in the first chamber 31, a first treatment gas discharged from the first chamber 31 may be burning-treated in the second chamber 32, and a second treatment gas discharged from the second chamber 32 may then be wetting-treated in the third chamber 33. Therefore, the generation of the solid by-product may be prevented and incomplete burning of the gas may be prevented to improve efficiency of an exhaust gas treatment.

A structure, an exhaust gas treatment method, and the like, of each chamber will hereinafter be described in detail. Arrows illustrated in FIG. 3 indicate movement directions of the exhaust gases and the reaction by-products.

The pipe L5 is connected to the first chamber 31, such that the exhaust gas may be injected from the process chamber 10 into the first chamber 31. A valve V1 may be provided at a connection portion between the first chamber 31 and the pipe L5. A first oxygen supply unit G1 is connected to the first chamber 31, such that a gas including oxygen $O_2$ may be injected into the first chamber 31 through a pipe L9. The first oxygen supply unit G1 may inject, for example, clean dry air (CDA) into the first chamber 31. A content of oxygen included in the gas injected by the first oxygen supply unit G1 may be 0 to about 20 wt %, but is not limited thereto, and may be changed depending on a type, a treatment amount, and the like, of the exhaust gas.

In the first chamber 31, materials having high reactivity in the exhaust gas may react with oxygen to auto-ignite. For example, an auto-ignition temperature of DCS in the exhaust gas is 55° C., and at least a portion of DCS may be removed by reacting with oxygen supplied by the first oxygen supply unit G1. However, a gas removed by the auto-ignition in the first chamber 31 is not limited to DCS, and other types of gases having high reactivity may be removed. In an example embodiment, gases having high reactivity (e.g., a Zr precursor, an Si precursor, a Ti precursor, a Hf precursor, etc.) used in the semiconductor manufacturing process may be removed in the first chamber 31, and for example, $WF_6$, $SiCl_4$, $SiH_4$, and the like, may be removed by the auto-ignition.

A by-product generated by the auto-ignition in the first chamber 31 may be introduced from a lower portion of the first chamber 31 into the tank 34 connected to the first chamber 31 (F2). For example, when DCS auto-ignites in the first chamber 31, silicon dioxide ($SiO_2$), which is a by-product, may fall to and be removed in the tank 34.

A gas (hereinafter, referred to as a 'first treatment gas') generated by oxidization of an auto-ignition material in the exhaust gas may move through a pipe L6 (refers to arrow F1 and arrow F3), and may be introduced into the second chamber 32.

The pipe L6 is connected to the second chamber 32, such that the first treatment gas may be introduced from the first chamber 31 into the second chamber 32 (refer to arrow F4). A valve V2 may be provided at a connection portion between the second chamber 32 and the pipe L6. A second oxygen supply unit G2 is connected to the second chamber 32, such that a gas including oxygen $O_2$ may be injected into the second chamber 32 through a pipe L10. For example, the second oxygen supply unit G2 may inject clean dry air (CDA) into the second chamber 32. A fuel supply unit G3 is connected to the second chamber 32, such that a fuel may be injected through the pipe L10. For example, the fuel supply unit G3 may inject a liquefied natural gas (LNG) into the second chamber 32.

Gases that are not removed in the first chamber 31 may be removed by burning in the second chamber 32. The second chamber 32 may include a burner BN. The second oxygen supply unit G2 and the fuel supply unit G3 may supply oxygen ($O_2$) and a fuel gas to the burner BN, respectively.

The burner BN may be disposed below the valve V2 and connected to the valve V2. For example, an upper portion of the burner BN may be connected to a lower portion of the valve V2. A lower portion of the burner BN may be connected to the interior space of the second chamber 32. The gases from the first chamber 31, the gas from the second oxygen supply unit G2 including oxygen $O_2$, and the fuel (e.g., LNG) from the fuel supply unit G3 may be introduced into the burner BN through the valve V2. The burner BN may use a method of treating the gases that are not removed in the first chamber 31 by making the gases pass through flames. The gas from the second oxygen supply unit G2 including oxygen $O_2$, and the fuel from the fuel supply unit G3 may increase fuel efficiency. A high-temperature flame may be created by burning oxygen and the fuel in the burner of the second chamber 32, and accordingly, the exhaust gas may be burned.

In an example embodiment, DCS remaining in the first treatment gas is burned in the second chamber 32, such that silicon dioxide ($SiO_2$), hydrogen chloride (HCl), or the like, may be generated. In the second chamber 32, silicon fluoride ($SiF_x$) included in the first treatment gas is burned, such that hydrogen fluoride (HF) or the like may be generated. A reaction by-product generated in the second chamber 32 may be introduced into the tank 34 (refer to arrow F6).

Since the nitrogen-containing gas is not included in the first treatment gas introduced into the second chamber 32, $NO_x$ due to the burning may not be generated. In addition, since the first treatment gas introduced into the second chamber 32 is not wetting-treated in the previous step, generation of carbon monoxide (CO) or the like due to incomplete burning of the exhaust gas and the fuel gas may be decreased.

The second chamber 32 may further include a temperature control device TC. Since the temperature control device TC maintains a temperature of the chamber rising by the flame within a predetermined range, an operator may operate more safely outside the scrubber. A type, a position, and the like, of the temperature control device TC are not limited as long as the temperature control device TC may control the temperature of the chamber. For example, the temperature control device TC may be positioned outside or inside the chamber, and may include a chiller, a water jetting unit, a heat insulating material, and the like. The temperature control device TC may be omitted according to example embodiments.

When the second chamber 32 includes a water jetting unit as the temperature control device TC, reaction by-products generated in the second chamber 32 may be dissolved in water and be more easily introduced into the tank 34. For example, hydrogen fluoride (HF), hydrogen chloride (HCl), silicon dioxide ($SiO_2$), and the like, generated by the burning in the second chamber 32 may be dissolved in water and introduced into the tank 34.

A gas (hereinafter, referred to as a 'second treatment gas') generated by the burning in the second chamber 32 may move through a pipe L7 (refer to arrow F5), and may be introduced into the third chamber 33.

The pipe L7 is connected to the third chamber 33, such that the second treatment gas may be introduced from the second chamber 32 into the third chamber 33 (F5). The third chamber 33 may include a water jetting unit WJ (e.g., a water jetter). In an example embodiment, the water jetting unit WJ of the third chamber 33 may be disposed at an upper portion of the third chamber 33, and may be disposed on a higher level than the pipe L7. The second treatment gas supplied to the third chamber 33 through the pipe L7 may come into contact with water jetted by the water jetting unit WJ while moving upward toward a pipe L8. Some (e.g., hydrogen fluoride (HF), hydrogen chloride (HCl), etc.) of the materials included in the second treatment gas may be dissolved in the water and introduced into the tank 34 (refer to arrow F9).

The third chamber 33 may further include filling materials FM. In an example embodiment, the filling materials FM may be disposed above the pipe L7 and below the water jetting unit WJ. The filling materials FM may delay a flow of the water jetted above the filling materials FM as much as possible to increase a contact area between the second treatment gas and the water. A shape of the filling materials is not limited, and may be, for example, a spherical shape, a cylindrical shape, or the like. The filling materials may include a material robust to fouling and corrosion.

A gas (hereinafter, referred to as a 'third treatment gas') cleaned by the water in the third chamber 33 may be discharged through the pipe L8 (refer to arrow F8). The third treatment gas may include water ($H_2O$), carbon dioxide ($CO_2$), nitrogen ($N_2$), and the like.

The scrubber 30 according to example embodiments may decrease incomplete burning of the exhaust gas. This may be confirmed by a color of a by-product generated in the pipe L8 through which the third treatment gas generated in the third chamber 33 of the scrubber 30 is discharged. The scrubber 30 according to example embodiments that does not perform a pre-wet treatment completely burns the exhaust gas, such that a white by-product may be generated in the pipe L8. On the other hand, in a scrubber in which the burning treatment after the pre-wet treatment is performed, an exhaust gas is incompletely burned, such that a gray or black by-product may be generated in the pipe L8. It may be confirmed whether or not the exhaust gas is completely burned by confirming the color of the by-product generated in the scrubber or in the pipe connected to the scrubber.

A structure of the scrubber 30 is not limited to that illustrated in FIG. 3, and sizes of the respective chambers, positions of the pipes, the number of pipes, and the like, may be changed according to example embodiments. For example, the first chamber, the second chamber 32, and the third chamber 33 may have the same height or the same volume as each other. In addition, the number, positions, and the like, of pipes (e.g., pipe L6 and pipe L7) connecting the respective chambers to each other may be changed. For example, the pipe L6 connecting the first chamber 31 and the second chamber 32 to each other may be disposed on side surfaces of the first chamber 31 and the second chamber 32, and the second chamber 32 and the third chamber 33 may be connected to each other by two or more pipes including an upper pipe and a lower pipe.

Next, a method of manufacturing a semiconductor device using a substrate processing system according to example embodiments will be described with reference to FIGS. 4 to 5B.

Figure 4:
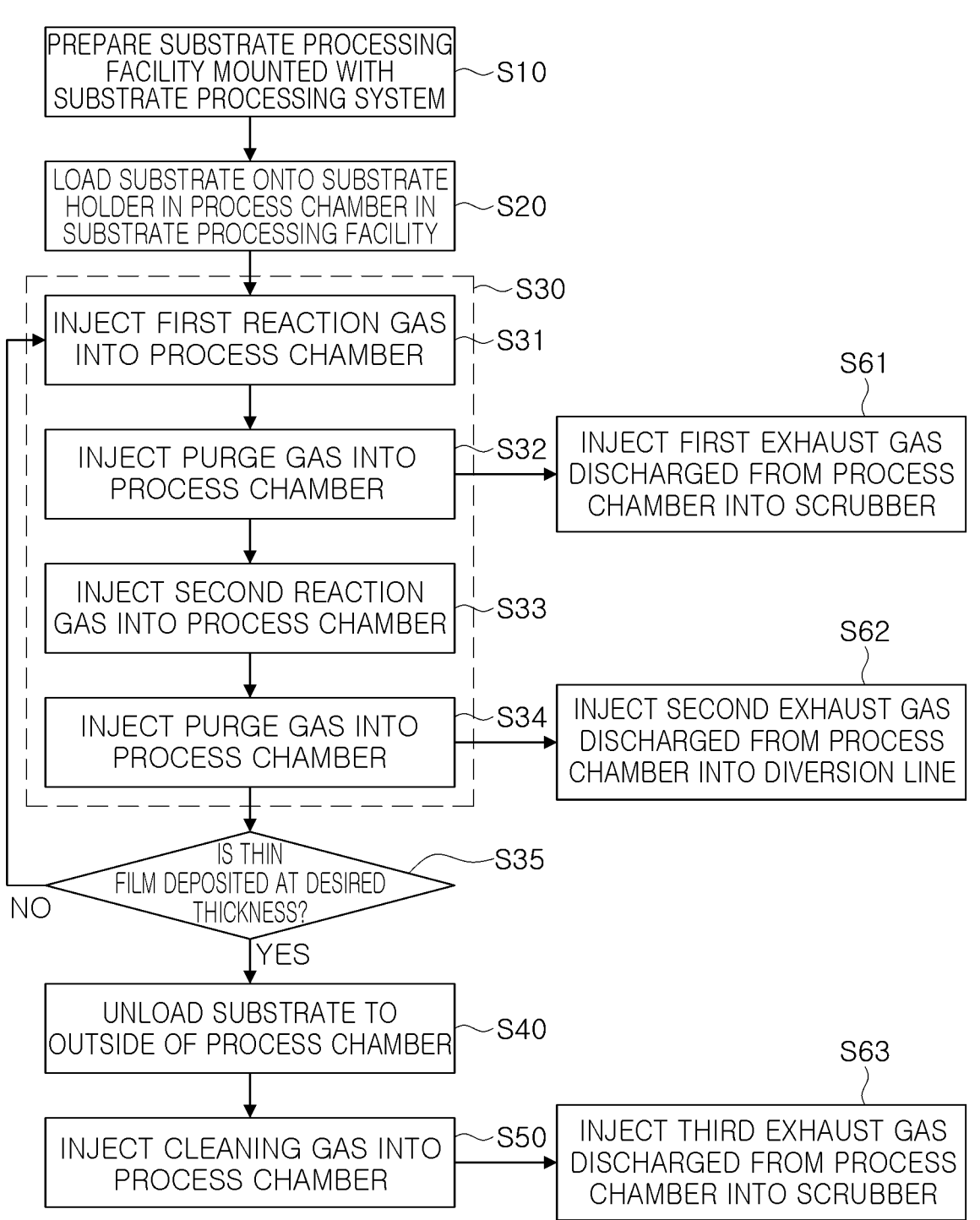
FIG. 4 is a schematic flowchart illustrating processes of a method of manufacturing a semiconductor device using a substrate processing system according to example embodiments.

FIG. 4 is a schematic flowchart illustrating processes of a method of manufacturing a semiconductor device using a substrate processing system according to example embodiments.

Figure 5A:
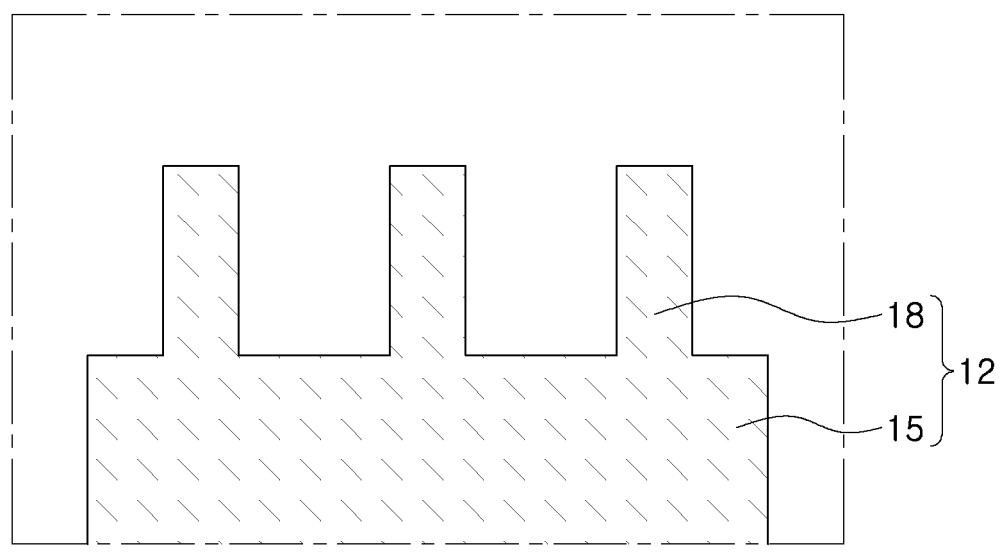
FIG. 5A is a first schematic cross-sectional view for describing the method of manufacturing a semiconductor device using a substrate processing system according to example embodiments.
Figure 5B:
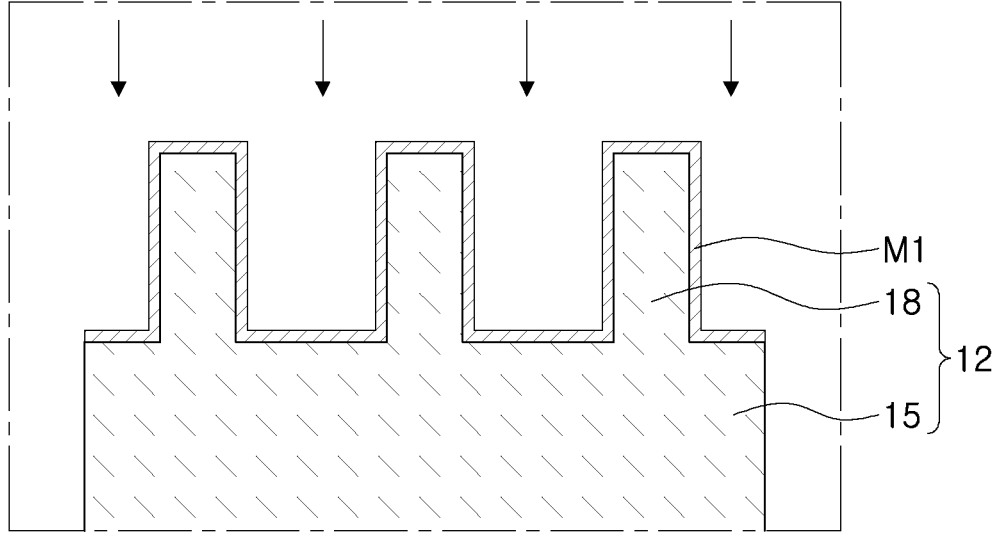
FIG. 5B is a second schematic cross-sectional view for describing the method of manufacturing a semiconductor device using a substrate processing system according to example embodiments.

FIGS. 5A and 5B are schematic cross-sectional views for describing the method of manufacturing a semiconductor device using a substrate processing system according to example embodiments.

Referring to FIGS. 1 and 4 to 5B together, a substrate processing facility mounted with a substrate processing system according to example embodiments may be prepared (step S10). The substrate processing system may be the substrate processing system 1 described with reference to FIGS. 1 to 3.

The substrate 12 may be loaded onto the substrate holder 11 disposed in the process chamber 10 in the substrate processing facility (step S20). In an example embodiment, as illustrated in FIG. 5A, the substrate 12 may include a lower structure 15 and an upper structure 18.

In order to deposit a thin film on an upper surface of the substrate 12, reaction gases may be injected into the process chamber 10 (step S30). In an example embodiment, the respective reaction gases may be injected into the process chamber 10 in the form of sequential pulses. Step S30 may include step S31, step S32, step S33, and step S34 to be described later.

A first reaction gas may be injected into the process chamber 10 (step S31). The first reaction gas may be deposited on the upper surface of the substrate 12 to form a first material layer M1. The first material layer M1 may be, for example, a precursor, which is a raw material of a thin film to be formed on the upper surface of the substrate 12. In an example embodiment, the first reaction gas may include DCS as a precursor for forming a silicon nitride ($SiN_x$) thin film on the upper surface of the substrate 12.

After step S31, a purge gas may be injected into the process chamber 10 (S32). In step S31, an extra first reaction gas that is not deposited on the upper surface of the substrate 12 may remain in the process chamber 10. The extra first reaction gas in the process chamber 10 may be discharged to the outside of the process chamber 10 by injecting the purge gas into the process chamber 10. The purge gas may include a gas (e.g., nitrogen ($N_2$), an inert gas (Ar, etc.)) that does not chemically react with the first reaction gas.

The first exhaust gas discharged to the outside of the process chamber 10 in step S32 may be injected into the scrubber 30 (see FIG. 1) (step S61). The first exhaust gas may include the extra first reaction gas (DCS) or the like. The first exhaust gas may be treated to become chemically safe gas through ignition, burning, and wetting treatments in the scrubber 30.

After step S32, a second reaction gas may be injected into the process chamber 10 (step S33). A second material layer may be formed on the first material layer formed on the upper surface of the substrate 12. The first material layer and the second material layer are deposited on the upper surface of the substrate 12, such that a thin film may be deposited. The second reaction gas may be a reactant reacting with the first reaction gas, which is the precursor. In an example embodiment, the second reaction gas may include $NH_3$ reacting with DCS as a reactant for forming the silicon nitride ($SiN_x$) thin film on the upper surface of the substrate 12. In example embodiments, heat or plasma required for a chemical reaction between the first reaction gas and the second reaction gas may be applied.

After step S33, a purge gas may be injected into the process chamber 10 (step S34). In step S33, an extra second reaction gas that is not deposited on the upper surface of the substrate 12 may remain in the process chamber 10. The extra second reaction gas in the process chamber 10 may be discharged to the outside of the process chamber 10 by injecting the purge gas.

The second exhaust gas discharged to the outside of the process chamber 10 in step S34 may be introduced into the diversion line 40 (see FIG. 1) (step S62). The second exhaust gas may include the extra second reaction gas $NH_3$. The second exhaust gas may be moved through the diversion line

40 and then be introduced into a separate scrubber device or be neutralized and removed with an acid solution.

According to example embodiments, step S31 to step S34 may be repeatedly performed once or twice or more. It may be determined whether to repeatedly perform step S31 to step S34 depending on a thickness of the thin film on the upper surface of the substrate 12 (step S35). When the thin film having a desired thickness is deposited on the upper surface of the substrate 12, step S40 is performed, and when the thin film having a desired thickness is not deposited on the upper surface of the substrate 12, step S31 to step S34 may be repeatedly performed.

After step S30, the substrate 12 may be unloaded to the outside of the process chamber 10 (step S40).

After step S40, a cleaning gas may be injected into the process chamber 10 (step S50). The thin film may be deposited on an inner wall of the process chamber 10 as well as the upper surface of the substrate 12 by step S30. In order to remove the thin film deposited on the inner wall of the process chamber 10, the cleaning gas may be injected into the process chamber 10. In an example embodiment, nitrogen fluoride ($NF_3$) may be injected into the process chamber 10 in order to remove silicon nitride ($SiN_x$) deposited on the inner wall of the process chamber 10. In some example embodiments, a gas such as argon (Ar) or helium (He) may also be injected for ignition before nitrogen fluoride ($NF_3$) is injected.

A by-product of the cleaning treatment may be discharged from the process chamber 10 by step S50. In an example embodiment, when silicon nitride ($SiN_x$) on the inner wall of the process chamber 10 is removed by nitrogen fluoride ($NF_3$), silicon fluoride ($SiF_x$) or the like may be generated as the by-product.

The by-product by the cleaning treatment discharged to the outside of the process chamber 10 in step S50 may be injected into the scrubber 30 (step S61). The by-product by the cleaning treatment may be treated to become a chemically safe gas through ignition, burning, and wetting treatments in the scrubber 30.

Next, a substrate processing system 1a according to example embodiments will be described with reference to FIG. 6.

Figure 6:
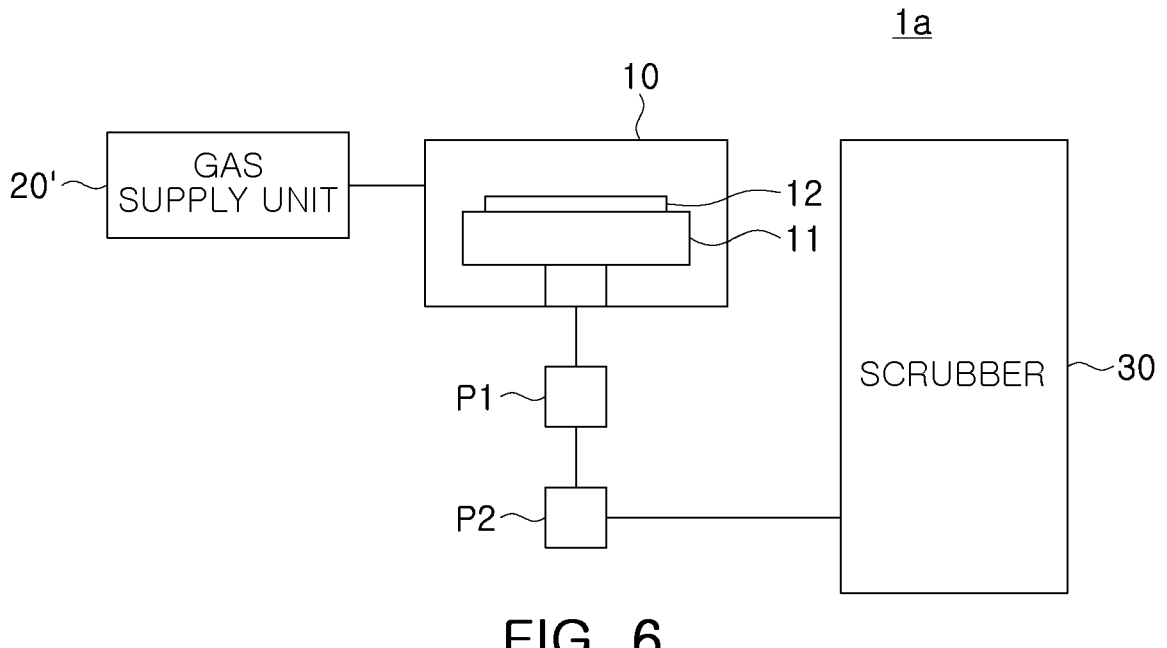
FIG. 6 is a conceptual diagram of a substrate processing system according to example embodiments.

FIG. 6 is a conceptual diagram of a substrate processing system 1a according to example embodiments. In an example embodiment of FIG. 6, features described above with the same reference numerals may be the same as or similar to those described above.

The substrate processing system 1a of FIG. 6 is different from the substrate processing system 1 according to an example embodiment of FIG. 1 in that it does not include the diversion line 40.

The substrate processing system 1a of FIG. 6 may not use a nitrogen-containing gas as a reaction gas. Accordingly, the substrate processing system 1a may not include the diversion line 40 for processing the nitrogen-containing gas. In an example embodiment, an ALD process of forming a thin film other than a silicon nitride-based thin film may be performed in a process chamber 10 of the substrate processing system 1a. In another example embodiment, a CVD process, an etching process, or the like, performed in the process chamber 10 may be performed.

Reaction gases may be supplied into the process chamber 10 by a gas supply unit 20'. One gas supply unit 20' has been illustrated in FIG. 6, but the number of gas supply units is not limited thereto, and may be plural. When the process chamber 10 is connected to a plurality of gas supply units, respective reaction gases may be sequentially or simultaneously injected into the process chamber 10.

The reaction gases injected into the process chamber 10 may be discharged from the process chamber 10 after a process is completed. Exhaust gases discharged from the process chamber 10 may be injected into a scrubber 30 and removed through oxidation, burning, and wetting treatments.

In the substrate processing system 1a of FIG. 6, a pre-wet treatment before burning is not performed in the scrubber 30, and thus, problems such as incomplete burning of the exhaust gases and contamination of the scrubber due to solid by-products may be decreased.

Figure 7:
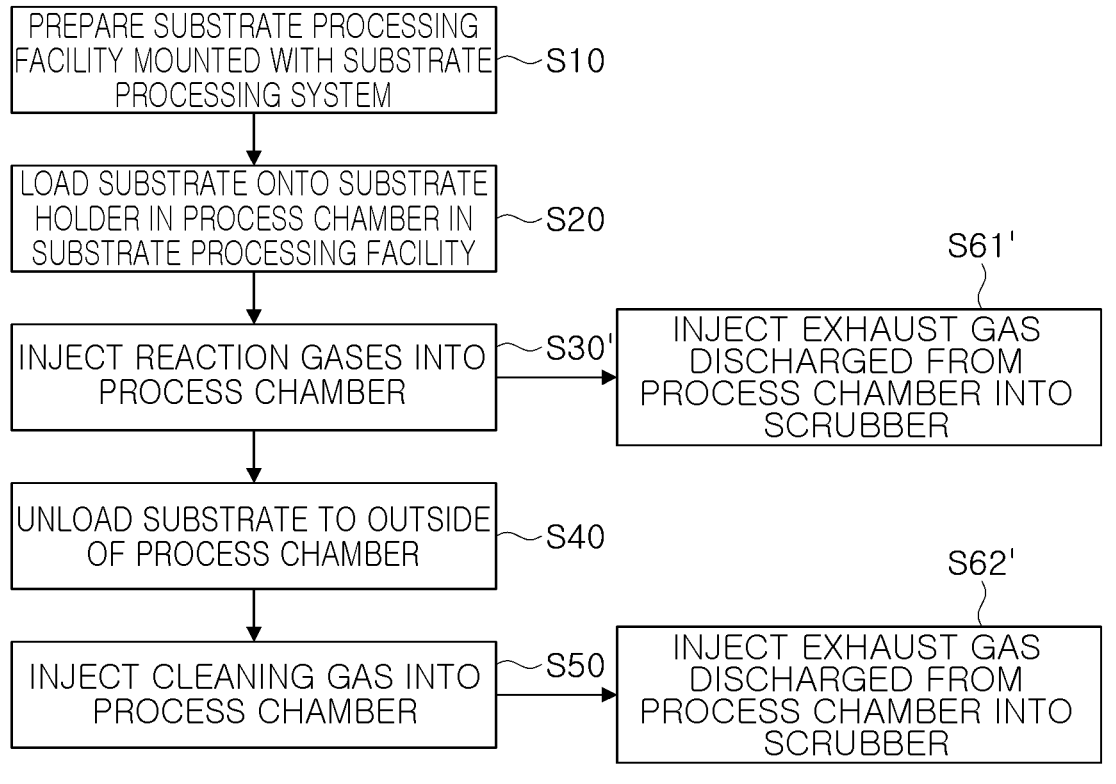
FIG. 7 is a schematic flowchart illustrating processes of a method of manufacturing a semiconductor device using a substrate processing system according to example embodiments.

Next, FIG. 7 is a schematic flowchart illustrating processes of a method of manufacturing a semiconductor device using a substrate processing system 1a according to example embodiments.

In an example embodiment of FIG. 7, features described above with the same reference numerals may be the same as or similar to those described above.

The method of manufacturing a semiconductor device of FIG. 7 is different from that according to an example embodiment of FIG. 4 in that exhaust gases discharged from the process chamber 10 are not introduced into a diversion line.

Referring to FIGS. 6 and 7 together, reaction gases may be injected into the process chamber 10 in step S30'. The reaction gases may be sequentially or simultaneously introduced. In step S61', an exhaust gas discharged from the process chamber 10 may be injected into the scrubber 30, and be subjected to ignition, burning, and wetting treatments.

After step S30', the substrate may be unloaded to the outside of the process chamber 10 (step S40), and a cleaning gas may be injected into the process chamber 10 (step S50). A by-product of the cleaning treatment may be discharged from the process chamber 10 by step S50. The by-product generated by S50 may be injected into and removed in the scrubber 30.

In the method of manufacturing the semiconductor device of FIG. 7, the nitrogen-containing gas may not be used. Since the nitrogen-containing gas is not included in the exhaust gas generated in a semiconductor manufacturing process, nitrogen oxides ($NO_x$) may not be generated even though the exhaust gas is subjected to the burning treatment without the pre-wet treatment in the scrubber.

The oxidation treatment, the burning treatment, the wetting treatment may be performed on the exhaust gases including the auto-ignition material to minimize discharge of a harmful gas while increasing a preventive maintenance (PM) cycle of an exhaust gas treatment device.

According to one or more embodiments, the supply units (e.g., the first gas supply unit 21, the second gas supply unit 22, the purge gas supply unit 23, the cleaning gas supply unit 24, the first oxygen supply unit G1, the second oxygen supply unit G2, and the fuel supply unit G3) may each include at least one body (e.g., a tank) that is configured to contain a fluid (e.g., a gas) and supply the fluid via at least one pipe connected thereto.

Those skilled in the art will appreciate that many variations and modifications may be made to the embodiments of the present disclosure without departing from the principles of the present disclosure. Therefore, the disclosed non-limiting example embodiments of the present disclosure are used in a generic and descriptive sense only and not for purposes of limitation.

14

What is claimed is:

1. A substrate processing system comprising:
a process chamber; and
a scrubber connected to the process chamber and configured to treat at least one from among exhaust gases discharged from the process chamber as a part of a semiconductor process on a substrate, the scrubber comprising:
a first oxygen supply unit that comprises a first gas containing oxygen ($O_2$);
a first chamber connected to the first oxygen supply unit and the process chamber, and configured to receive the first gas containing the oxygen from the first oxygen supply unit, receive the exhaust gases discharged from the process chamber, and obtain a first treatment gas by oxidizing at least some of the exhaust gases using the oxygen supplied from the first oxygen supply unit;
a second chamber connected to the first chamber, and configured to receive the first treatment gas from the first chamber, and obtain a second treatment gas by burning the first treatment gas;
a third chamber connected to the second chamber, and configured to receive the second treatment gas from the second chamber, and perform a wetting treatment of the second treatment gas; and
a tank disposed below the first chamber, the second chamber, and the third chamber, and connected to each of the first chamber, the second chamber, and the third chamber.

2. The substrate processing system of claim 1, wherein the first chamber is configured to ignite and oxidize the at least some of the exhaust gases by the exhaust gases contacting with the oxygen, supplied from the first oxygen supply unit, in the first chamber.

3. The substrate processing system of claim 2, wherein the process chamber is configured to exhaust dichlorosilane (DCS: $SiH_2Cl_2$) as a part of the at least some of the exhaust gases that is ignited and oxidized in the first chamber.

4. The substrate processing system of claim 1, wherein a content of the oxygen included in the first gas of the first oxygen supply unit is more than 0 wt % and less than equal to 20 wt %.

5. The substrate processing system of claim 1, wherein the first chamber, the second chamber, and the third chamber are connected to the tank such that by-products generated in the first chamber, the second chamber, and the third chamber are introduced into the tank.

6. The substrate processing system of claim 1, wherein the scrubber further comprises:
a second oxygen supply unit connected to the second chamber and configured to inject a second gas including oxygen ($O_2$) into the second chamber; and
a fuel supply unit connected to the second chamber and configured to inject a fuel into the second chamber.

7. The substrate processing system of claim 6, wherein the fuel injected into the second chamber by the fuel supply unit comprises a liquefied natural gas (LNG).

8. The substrate processing system of claim 1, wherein the second chamber comprised a burner mounted therein.

9. The substrate processing system of claim 1, wherein the second chamber further comprises a temperature control device disposed on an inner wall or an outer wall of the second chamber.

10. The substrate processing system of claim 1, wherein the third chamber comprises a water jetter mounted therein.

11. The substrate processing system of claim 10, wherein the scrubber further comprises a pipe that connects the second chamber to the third chamber, and is configured to introduce the second treatment gas from the second chamber into the third chamber, wherein the pipe is disposed on a lower level than a level of the water jetter that is within the third chamber.

12. The substrate processing system of claim 1, wherein the third chamber is configured to dissolve, by the wetting treatment, a water-soluble material included in the second treatment gas, and the third chamber is connected to the tank such that the water-soluble material is introduced into the tank.

13. The substrate processing system of claim 1, wherein the third chamber is configured to obtain a third treatment gas by performing the wetting treatment of the second treatment gas, and is further configured to discharge the third treatment gas, and the third treatment gas comprises water ($H_2O$) or carbon dioxide ($CO_2$).

14. The substrate processing system of claim 1, wherein the scrubber is configured to treat a first exhaust gas, from among the exhaust gases discharged from the process chamber, as a part of a first process cycle of the semiconductor process; and wherein the substrate processing system further comprises:

a diversion line connected to the process chamber and configured to separate a second exhaust gas, from among the exhaust gases discharged from the process chamber, as a part of a second process cycle of the semiconductor process; and a controller comprising at least one processor, the controller configured to cause the first process cycle of the semiconductor process and the second process cycle of the semiconductor process to be alternately repeated by controlling at least one from among the process chamber, the scrubber, and the diversion line, and wherein the first chamber is configured to obtain the first treatment gas by oxidizing the first exhaust gas.

15. The substrate processing system of claim 14, wherein the controller is further configured to cause a third process cycle of the semiconductor process to be performed after the first process cycle and the second process cycle are alternately repeated, and the controller controls the scrubber to treat a third exhaust gas discharged from the process chamber in the third process cycle.

16. The substrate processing system of claim 15, wherein the first exhaust gas comprises dichlorosilane (DCS: $SiH_2Cl_2$), the second exhaust gas comprises ammonia ($NH_3$), and the third exhaust gas comprises silicon fluoride ($SiF_x$).

* * * * *